United States Patent
Su et al.

(10) Patent No.: US 10,446,423 B2
(45) Date of Patent: Oct. 15, 2019

(54) NEXT GENERATION WARPAGE MEASUREMENT SYSTEM

(71) Applicant: APPLIED MATERIALS, INC., Santa Clara, CA (US)

(72) Inventors: Jun-Liang Su, Singapore (SG); Karthik Elumalai, Bangalore (IN); Eng Sheng Peh, Singapore (SG); Sriskantharajah Thirunavukarasu, Singapore (SG); Dimantha Rajapaksa, Ragama (LK)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/623,503

(22) Filed: Jun. 15, 2017

(65) Prior Publication Data

US 2018/0144960 A1    May 24, 2018

Related U.S. Application Data

(60) Provisional application No. 62/424,422, filed on Nov. 19, 2016.

(51) Int. Cl.
*G01B 11/14*    (2006.01)
*H01L 21/67*    (2006.01)
(Continued)

(52) U.S. Cl.
CPC ........ *H01L 21/67288* (2013.01); *G01B 11/24* (2013.01); *G01B 11/306* (2013.01); *H01L 21/677* (2013.01); *H01L 21/67383* (2013.01)

(58) Field of Classification Search
CPC ........... G01N 21/8851; G01N 21/9501; G01N 21/896; G01N 21/59; G01N 21/86;
(Continued)

(56) References Cited

U.S. PATENT DOCUMENTS 4,503,330 A * 3/1985 Hearn .................. G01F 23/288
250/357.1
4,806,773 A * 2/1989 Hiraga .............. H01L 21/67265
250/548
(Continued)

FOREIGN PATENT DOCUMENTS

JP    2010-243205 A    10/2010

OTHER PUBLICATIONS

International Search Report and Written Opinion dated Mar. 7, 2018 for PCT Application No. PCT/US 2017/061927.

*Primary Examiner* — Hoa Q Pham
(74) *Attorney, Agent, or Firm* — Moser Taboada; Alan Taboada

(57) ABSTRACT

Systems, apparatuses and methods for determining a surface profile of a substrate are provided. In one embodiment, a method includes projecting a signal having a vertical component/profile across the surface of the substrate from a plurality of locations along a first side of the substrate, capturing the projected signals at each of a plurality of respective locations across the surface of the substrate and determining a surface profile for the substrate using the captured signals. The process can be automated using a controller having predetermined projection and capture positions along respective sides of the substrate, where a surface profile of the substrate can be automatically determined by the controller using the captured signals.

20 Claims, 7 Drawing Sheets

(51) Int. Cl.
  *G01B 11/24* (2006.01)
  *H01L 21/673* (2006.01)
  *H01L 21/677* (2006.01)
  *G01B 11/30* (2006.01)

(58) Field of Classification Search
  CPC ... H01L 22/12; H01L 22/67288; G01B 11/16; G01B 11/24; G01B 2210/56; G01B 21/20
  USPC .... 356/399–401, 237.1–237.5, 239.1, 239.2, 356/239.7, 239.8, 601–623; 250/559.29, 250/559.3, 548
  See application file for complete search history.

(56) References Cited

U.S. PATENT DOCUMENTS

| | | | |
|---|---|---|---|
| 5,231,767 A * | 8/1993 | Brinley | G01B 5/285 33/522 |
| 5,798,532 A | 8/1998 | Linehan | |
| 6,097,492 A * | 8/2000 | Kondo | H01L 21/681 250/548 |
| 6,303,939 B1 * | 10/2001 | Chung | H01L 21/67265 250/559.29 |
| 6,813,032 B1 | 11/2004 | Hunter | |
| 6,927,079 B1 * | 8/2005 | Fyfield | G01R 31/311 438/11 |
| 8,228,509 B2 * | 7/2012 | Akamatsu | G01B 11/24 356/610 |
| 8,395,783 B2 | 3/2013 | Donaher et al. | |
| 8,402,785 B2 * | 3/2013 | Chen | G01B 11/306 250/559.12 |
| 8,582,963 B2 * | 11/2013 | Li | F27B 17/0025 118/728 |
| 8,599,366 B2 * | 12/2013 | Schindler | H01L 21/67288 356/3.01 |
| 9,279,673 B2 | 3/2016 | Ko et al. | |
| 9,401,277 B2 | 7/2016 | Wang et al. | |
| 9,453,721 B2 | 9/2016 | Akita et al. | |
| 2007/0087529 A1 | 4/2007 | Chung et al. | |
| 2008/0153182 A1 | 6/2008 | Herchen et al. | |
| 2009/0278287 A1 | 11/2009 | Wang et al. | |
| 2011/0028003 A1 | 2/2011 | Wang et al. | |
| 2012/0071007 A1 | 3/2012 | Wang et al. | |
| 2016/0293556 A1 | 10/2016 | Uzoh | |
| 2017/0038202 A1 | 2/2017 | Saito | |

* cited by examiner

NEXT GENERATION WARPAGE MEASUREMENT SYSTEM

CROSS-REFERENCE TO RELATED APPLICATIONS

This application claims benefit of U.S. provisional patent application Ser. No. 62/424,422, filed Nov. 19, 2016, which is herein incorporated by reference in its entirety.

FIELD

Embodiments of the present disclosure generally relate to systems, apparatuses and methods for processing a substrate and, particularly, to systems, apparatuses and methods for determining a surface profile of a substrate.

BACKGROUND

Warped substrates are a problem which prevent the substrates from being chucked fully on a process chamber pedestal. Such warpage leads to a delay in or ceasing of the substrate processing.

For example, epoxy mold compounds are used to encapsulate dies in substrate packaging. These compounds bow and warp after thermal processes due to inhomogeneous heating and cooling, causing non-uniform expansion/contraction rates in current process equipment. Conventional thermal processes utilize directional heat transfer via radiative, convective or conductive thermal processes. The directionality results in anisotropic expansion and contraction rates. When operated near the thermoplastic regime, non-uniform cooling and, subsequently, contraction rates give rise to a warped substrate. Such warp and bow effects are frequently observed and imply that the substrate is being processed close to the thermoplastic regime of the substrate, giving rise to substrate warpage beyond acceptable levels.

Being able to detect and measure the warpage before, during or after any process would result in benefits to production throughput and yield.

SUMMARY

Embodiments of substrate measurement system, apparatus and method for determining a surface profile for a substrate to determine, for example, substrate warpage are provided herein. In various embodiments in accordance with the present principles, a method for determining a surface profile for a substrate includes projecting a signal having a vertical component/profile across the surface of the substrate from a plurality of locations along an edge of the substrate, capturing the projected signals at each of a plurality of respective locations across the surface of the substrate, and determining a surface profile for the substrate using the captured signals.

In another embodiment in accordance with the present principles, an apparatus for determining a surface profile for a substrate includes a first sensor pair including a first transmitter for projecting a signal having a vertical component/profile across a surface of the substrate from a plurality of locations along an edge of the substrate and a first receiver for capturing the projected signals from the first transmitter at each of a plurality of respective locations across the surface of the substrate. The apparatus further includes a first track assembly for moving the first sensor pair across at least a portion of the surface of the substrate, a first encoder for determining positional information associated with the first track assembly and a substrate support for holding the substrate. In various embodiments the first receiver communicates information associated with the captured signals from the first transmitter to a controller and the first encoder communicates the determined positional information of the first track assembly to the controller to be used by the controller to determine a surface profile for the substrate using the information associated with the captured signals and the positional information.

In some embodiments in accordance with the present principles, the above described apparatus further includes a second sensor pair including a second transmitter for projecting a signal having a vertical component/profile across a surface of the substrate perpendicular to the signal projected from the first transmitter from a plurality of locations along an edge of the substrate and a second receiver for capturing the projected signals from the second transmitter at each of a plurality of respective locations across the surface of the substrate. The apparatus can further include a second track assembly for moving the second sensor pair across at least a portion of the surface of the substrate, and a second encoder for determining positional information associated with the second track assembly. In such an embodiment, the second receiver communicates information associated with the captured signals from the second transmitter to the controller and the second encoder communicates the determined positional information of the second track assembly to the controller to be used by the controller to determine a surface profile for the substrate using the information associated with the captured signals and the positional information.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
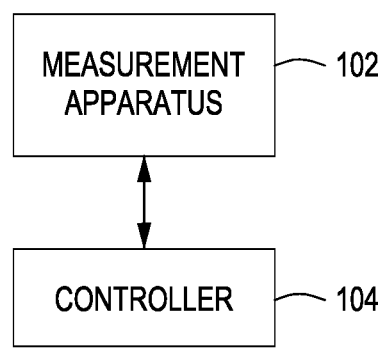
FIG. 1 depicts a high level block diagram of a system for determining a profile of a surface of a substrate in accordance with an embodiment of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Systems, apparatuses and methods for determining a surface profile for a substrate to determine, for example, substrate warpage are provided herein. The inventive systems, apparatuses and methods advantageously facilitate the detection and measurement of a warped substrate. Although embodiments of the present principles will be described with respect to specific sensors having specific configurations, other types of sensors and sensor configurations can be used without departing from the scope of the present principles. In addition, although in the embodiments presented herein a sensor transmitting unit and receiving unit are depicted as having specific locations on an apparatus, the locations of the transmitting unit and receiving unit can be interchanged.

FIG. 1 depicts a high level block diagram of a system 100 for determining a surface profile for a substrate in accordance with an embodiment of the present principles. The system 100 of FIG. 1 illustratively comprises a substrate measurement apparatus 102 and a controller 104. In one embodiment of the present principles, a substrate to be measured is placed in the substrate measurement apparatus 102 and measurements taken by at least one sensor assembly (see FIG. 2) of the substrate measurement apparatus 102 are communicated to the controller 104 for processing.

Figure 2:
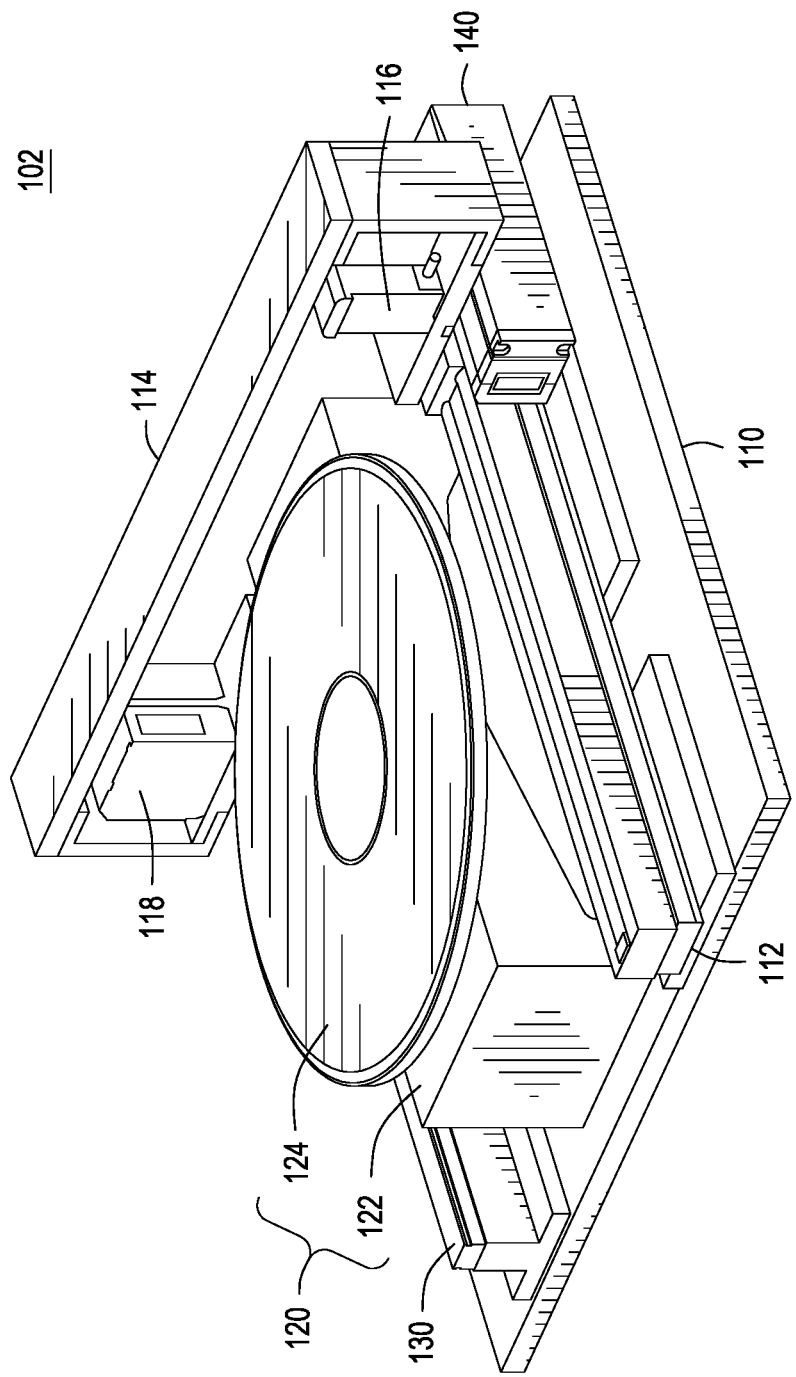
FIG. 2 depicts a high level block diagram of a substrate measurement apparatus suitable for use in the system of FIG. 1 for determining a profile of a surface of a substrate in accordance with an embodiment of the present principles.

FIG. 2 depicts a high level block diagram of a substrate measurement apparatus 102 for determining a surface profile for a substrate suitable for use in the system 100 of FIG. 1 in accordance with embodiments of the present principles. The substrate measurement apparatus 102 of FIG. 2 illustratively comprises a base 110, a track assembly 112, a sensor support assembly 114, a sensor assembly (e.g., sensor pair) including a transmitter unit 116 and a receiver unit 118, a substrate support assembly 120 including a substrate support base 122 and a substrate support 124, and an encoder 140. The substrate measurement apparatus 102 of FIG. 2 further depicts an optional guide 130, which will be described in further detail below.

In the embodiment of the substrate measurement apparatus 102 of FIG. 2, the transmitter unit 116 is mounted on one end of the sensor support assembly 114 and the receiver unit 118 is mounted on the other end of the sensor support assembly 114. The sensor support assembly 114 is configured such that the transmitter unit 116, when mounted on the sensor support assembly 114, can be located on one side of the substrate support 124 and as such a substrate to be tested, and the receiver unit 118, when mounted on the sensor support assembly 114, can be located on the other side of the substrate support 124 and a substrate to be tested. In some embodiments, the receiver unit 118 is positioned directly across from the transmitter unit 116 on an opposite side of the substrate support 124 and a substrate to be tested.

The mounting of the transmitter unit 116 and the receiver unit 118 onto the sensor support assembly 114 and the positioning of the sensor support assembly 114 in the substrate measurement apparatus 102 are such that at least a portion of a signal communicated from the transmitter unit 116 toward the receiver unit 118 comes into contact with a surface of a substrate to be tested. In addition, the transmitter unit 116 and the receiver unit 118 are positioned on the sensor support assembly 114 such that a signal communicated from the transmitter unit 116 is directed to the receiver unit 118 to be captured by the receiver unit 118.

Although in the embodiment of FIG. 2, the sensor support assembly 114 comprises a "U"-shaped assembly, in other embodiments in accordance with the present principles, the sensor support assembly 114 can comprise substantially any shape that enables the transmitter unit 116, when mounted on the sensor support assembly 114, to be located on one side of a substrate to be tested and the receiver unit 118, when mounted on the sensor support assembly 114, to be located on the other side of a substrate to be tested, such that when the sensor support assembly 114 and mounted transmitter unit 116 and receiver unit 118 are moved across the substrate support 124 and a substrate to be tested, the sensor support assembly 114 and mounted transmitter unit 116 and receiver unit 118 do not come into contact with the substrate support 124 and a substrate to be tested and do not interfere with the testing of the substrate as described herein.

In the embodiment of FIG. 2, the sensor support assembly 114 is mounted on the track assembly 112 such that the sensor support assembly 114, having the sensor assembly mounted thereon, can be translated across at least a portion of the substrate support 124 and a substrate to be tested. As depicted in the embodiment of FIG. 2, the track assembly 112 enables the movement of the sensor support assembly 114, and mounted transmitter unit 116 and receiver unit 118, across at least a portion of if not the entire substrate support 124, which is mounted on the substrate support base 122.

In the embodiment of FIG. 2, the encoder 140 is mounted on the track assembly 112. The encoder 140 can be used to determine positional information of the track assembly 112 as will be described in greater detail below.

Although in the embodiment of FIG. 2, the track assembly 112 is depicted as being located on a right side of the substrate measurement apparatus 102, in other embodiments in accordance with the present principles, the track assembly 112 can be located in substantially any position on the base 110 of the substrate measurement apparatus 102 that enables the track assembly 112 to move/translate the sensor support assembly 114, having the sensor assembly mounted thereon, across at least a portion of a substrate to be tested without interfering with the measurements to be taken. In addition, although in the embodiment of FIG. 2, the substrate support 124 and the substrate support base 122 are depicted as separate components, in other embodiments in accordance with the present principles, a substrate support and a substrate support base can comprise a single unit.

In the embodiment of the substrate measurement apparatus 102 of FIG. 2, the track assembly 112, the substrate support base 122 and the optional guide 130 are illustratively mounted to the base 110. In the embodiment of FIG. 2, the guide 130 is implemented to assist in moving the sensor support assembly 114, having the sensor assembly mounted thereon, across the substrate support 124. The guide 130 can be used to maintain a position of the sensor support assembly 114, and as such the sensor assembly, relative to the substrate support 124 and, as such, a substrate to be tested as the sensor support assembly 114 is being moved across the substrate support 124. For example, in one embodiment, the guide 130 can be used to assist in maintaining a level condition between the sensor support assembly 114 and, as such, the sensor assembly, and the substrate support 124.

In some embodiments in accordance with the present principles, the track assembly 112 can comprise a linear actuator, the encoder 140 can comprise a linear encoder and the sensor assembly can comprise a laser micrometer. In alternate embodiments the track assembly 112 can comprise a Robo Cylinder® and the sensor assembly can comprise a sensor capable of projecting light or sound having at least a vertical component/profile and receiving at least a portion of the projected light or sound such that a determination can be made as to a surface profile of a substrate to be tested based on, for example, a portion of the light or sound received by a receiver and/or blocked (not received by the receiver) by the surface of a substrate under test.

Figure 3:
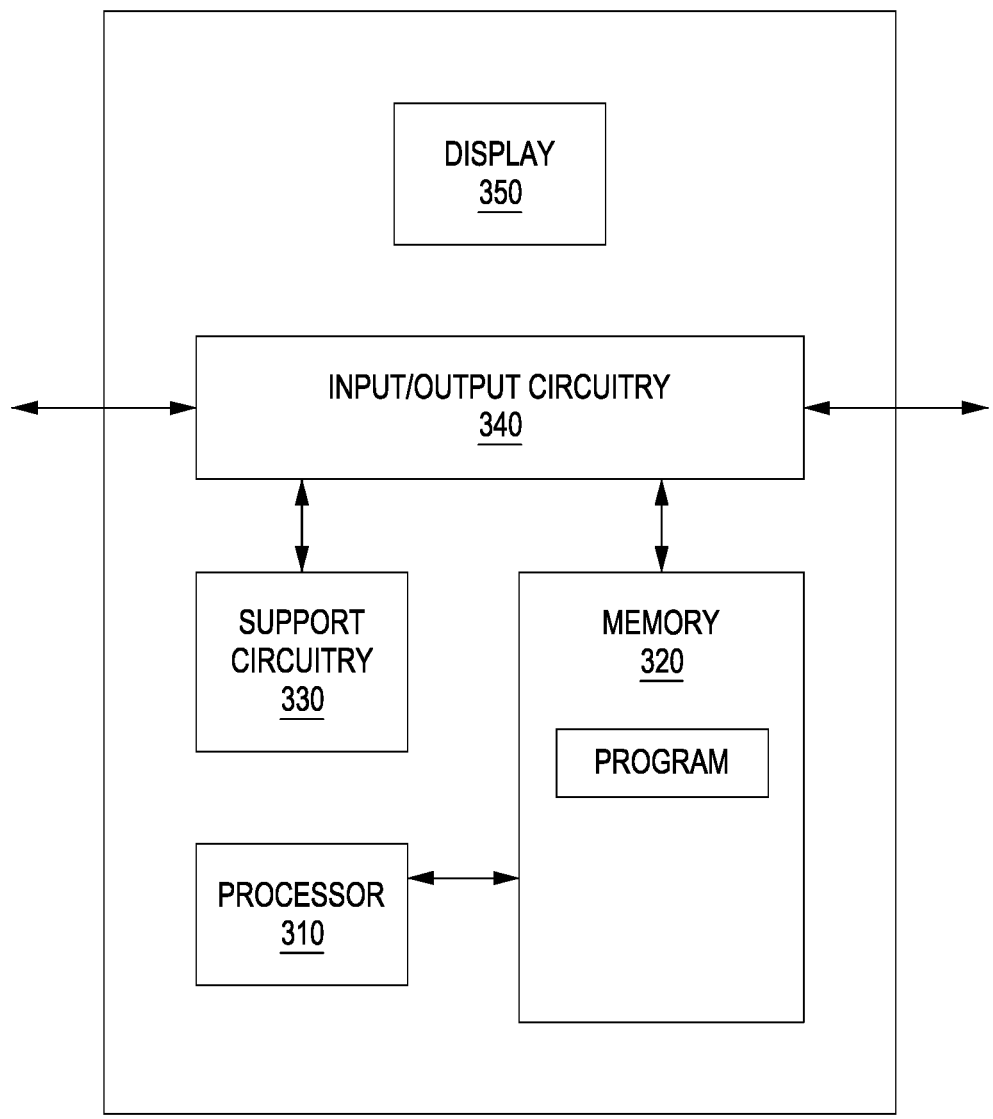
FIG. 3 depicts a high level block diagram of a controller suitable for use in the system of FIG. 1 in accordance with an embodiment of the present principles.

FIG. 3 depicts a high level block diagram of a controller 104 suitable for use in the system 100 of FIG. 1 in accordance with an embodiment of the present principles. The controller 104 of FIG. 3 illustratively comprises a processor 310 as well as a memory 320 for storing control programs, buffer pools, human-machine interface (HMI) programs, graphical user interface (GUI) programs and the like. The processor 310 cooperates with support circuitry 330 such as power supplies, clock circuits, cache memory and the like as well as circuits that assist in executing the software routines/programs stored in the memory 320. As such, some of the process steps discussed herein as software processes may be implemented within hardware, for example, as circuitry that cooperates with the processor 310 to perform various steps. The controller 104 also contains input-output circuitry 340 that forms an interface between the various functional elements communicating with the controller 104. As depicted in the embodiment of FIG. 3, the controller 104 can further include a display 350.

Although the controller 104 of FIG. 3 is depicted as a general purpose computer, the controller 104 is programmed to perform various specialized control functions in accordance with the present principles and embodiments can be implemented in hardware, for example, as an application specified integrated circuit (ASIC). As such, the process steps described herein are intended to be broadly interpreted as being equivalently performed by software, hardware, or a combination thereof.

In one operational embodiment, a substrate is mounted on the substrate support 124. The track assembly 112 is then used to move the sensor support assembly 114, having the sensor assembly thereon, across the surface of the substrate. During the movement, the transmitter unit 116 projects a signal, for example a laser beam having a vertical component/profile (e.g., a column of laser light), across the surface of the substrate to the receiver unit 118. For example, the track assembly 112 positions the transmitter unit 116 at various positions along one side of the substrate under test such that the transmitter unit 116 is able to project a signal (e.g., a vertical column of light) from various locations along the edge of one side of the substrate, across the substrate surface, to various respective locations on the other side of the substrate.

The receiver unit 118 captures the projected signal (e.g. vertical column of light) and detects any disturbances or interruptions in the signal from the transmitter unit 116. For example, in an embodiment in which the sensor assembly comprises a digital micrometer, the transmitter unit 116 directs a laser beam having a vertical component/profile across the surface of the substrate to the receiver unit 118. If the substrate is warped, the elevated portions of the warped substrate will block portions of the laser beam captured by the receiver unit 118. Information regarding the remaining laser signal captured by the receiver unit 118 or the laser signal blocked by the surface of the substrate under test can be used to generate a profile of a surface of the substrate.

For example, in various embodiments the dimensions of the signal projected from the transmitter unit 116 are known. As the signal from the transmitter unit 116 moves across the surface of a substrate, raised portions on the surface of the substrate block portions of the signal as is translates across the surface of the substrate. As such, the respective signals captured by the receiver unit 118, as the receiver unit 118 moves across the surface of the substrate, will be missing some portion of the signal. Information regarding, for example, a height of the portion of the missing signal can be used to determine a height of the rise in the surface of the substrate for the location on the surface of the substrate over which the signal traveled before being captured by the receiver unit 118.

In one embodiment in accordance with the present principles, the sensor assembly has an internal alignment system that produces a small optical signal when the transmitter unit 116 and receiver unit 118 are properly aligned. In various embodiments, the transmitter unit 116 can be aligned such that a bottom of the signal (e.g., vertical column of light) from the transmitter unit 116 just touches a top surface of the substrate support 124. In some other embodiments, the transmitter unit 116 can be aligned such that a bottom of the signal from the transmitter unit 116 just touches a lowest point on the top surface of a substrate to be tested.

In one operational embodiment in accordance with the present principles, the sensor assembly (e.g., digital micrometer) is moved over a distance equal to the entire surface of a substrate on the substrate support 124 and measurements are collected by the sensor assembly, based on a sampling rate, during the length of the travel. The collected measurements are used to generate a profile of the surface of the substrate as seen from the sides (as described above), resulting in a representation of the shape of the substrate surface at least at portions of the substrate at which sensor measurements were taken. During such measurements, the encoder 140 provides positional information of the sensor support assembly 114 and as such, the sensor assembly, to, for example, the controller 104. Such positional information can include a position of the sensor assembly with respect to a location on the surface of a substrate under test for at least locations on the surface of the substrate at which measurements were taken. The measurement information for the receiver unit 118 and the positional information from the encoder can be associated with a time and location relative to the substrate surface during which the sensor assembly is triggered to take measurements. Such measurement information and positional information can be used by the controller 104 to determine a surface profile for a substrate under test. The controller 104 can provide data management, for example, the visual presentation of data, for detecting trends, patterns, signatures and the like. The data can then be collected, analyzed and used to, for example, devise corrective or preventive measures for warped substrates.

In various embodiments in accordance with the present principles, the controller 104 is implemented to control the movement of the sensor support assembly 114 via the track assembly 112 (e.g., linear actuator) and to trigger measurements by the sensor assembly (e.g., laser micrometer). For example, in one operational embodiment, the controller 104 communicates a signal to the track assembly 112 to cause the track assembly 112 to move at predetermined increments. The controller 104 can then communicate a signal to the sensor assembly to project a signal across the surface of the substrate using the transmitter unit 116 and to capture the projected signal using the receiver unit 118.

For example, in one embodiment, the controller 104 communicates a signal to the track assembly 112 to cause the track assembly to move in increments of 10 mm, although other increments can be used. In various embodiments, the encoder 140 on the track assembly 112 communicates a feedback signal to the controller 104 to inform the controller 104 of the position of the track assembly 112. When the track assembly 112 reaches an intended position, the controller 104 communicates a signal to the sensor assembly to cause the sensor assembly to capture a measurement at the intended position. The sensor assembly communicates a signal representative of the measurement to the controller 104. The controller 104 can store the received signal to be used to determine a profile of the surface of the substrate and/or present a representation of the signal associated with the measurement on the display 350.

Figure 4:
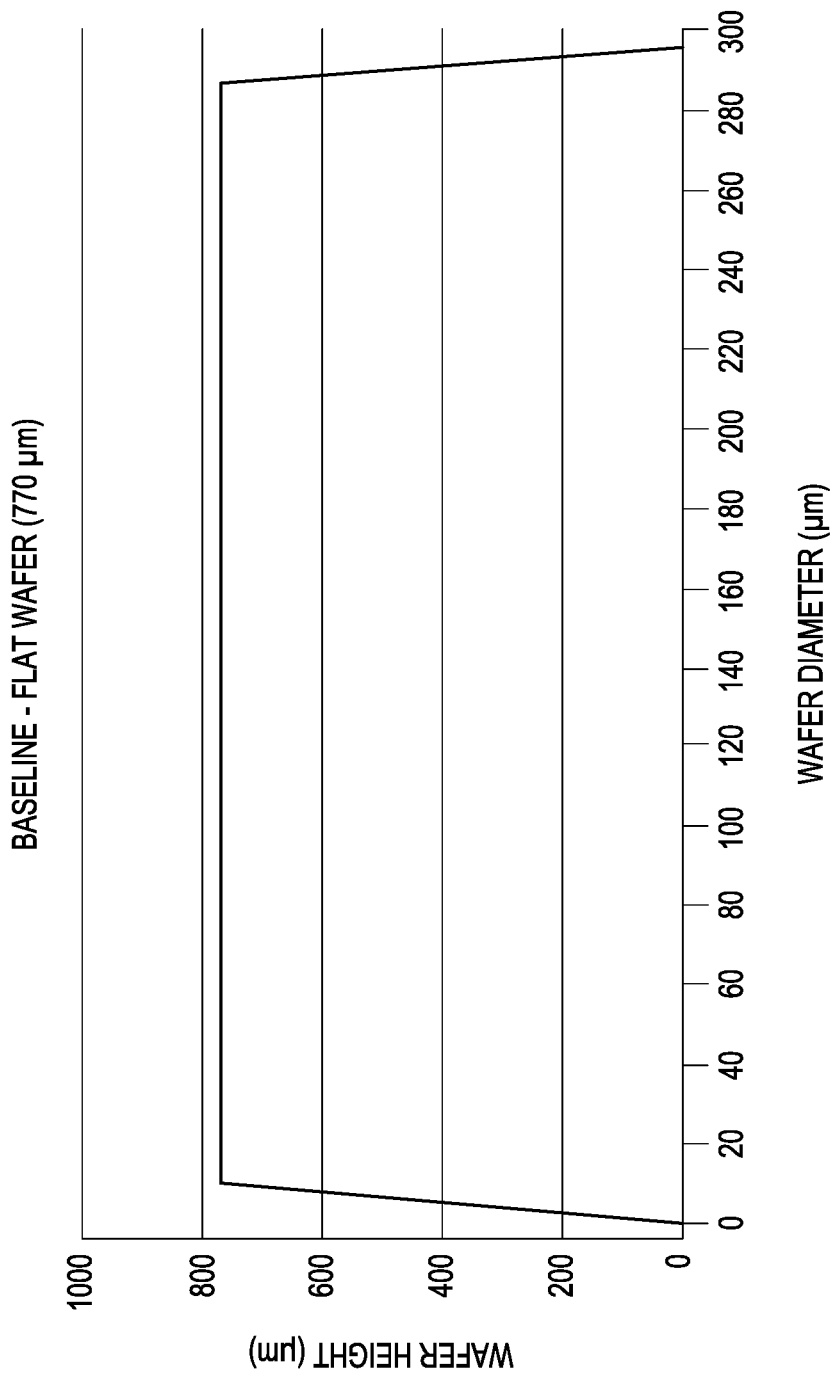
FIG. 4 depicts a graphical representation of plotted measurements of the sensor assembly of a substrate measurement apparatus on a flat substrate in accordance with an embodiment of the present principles.
Figure 5:
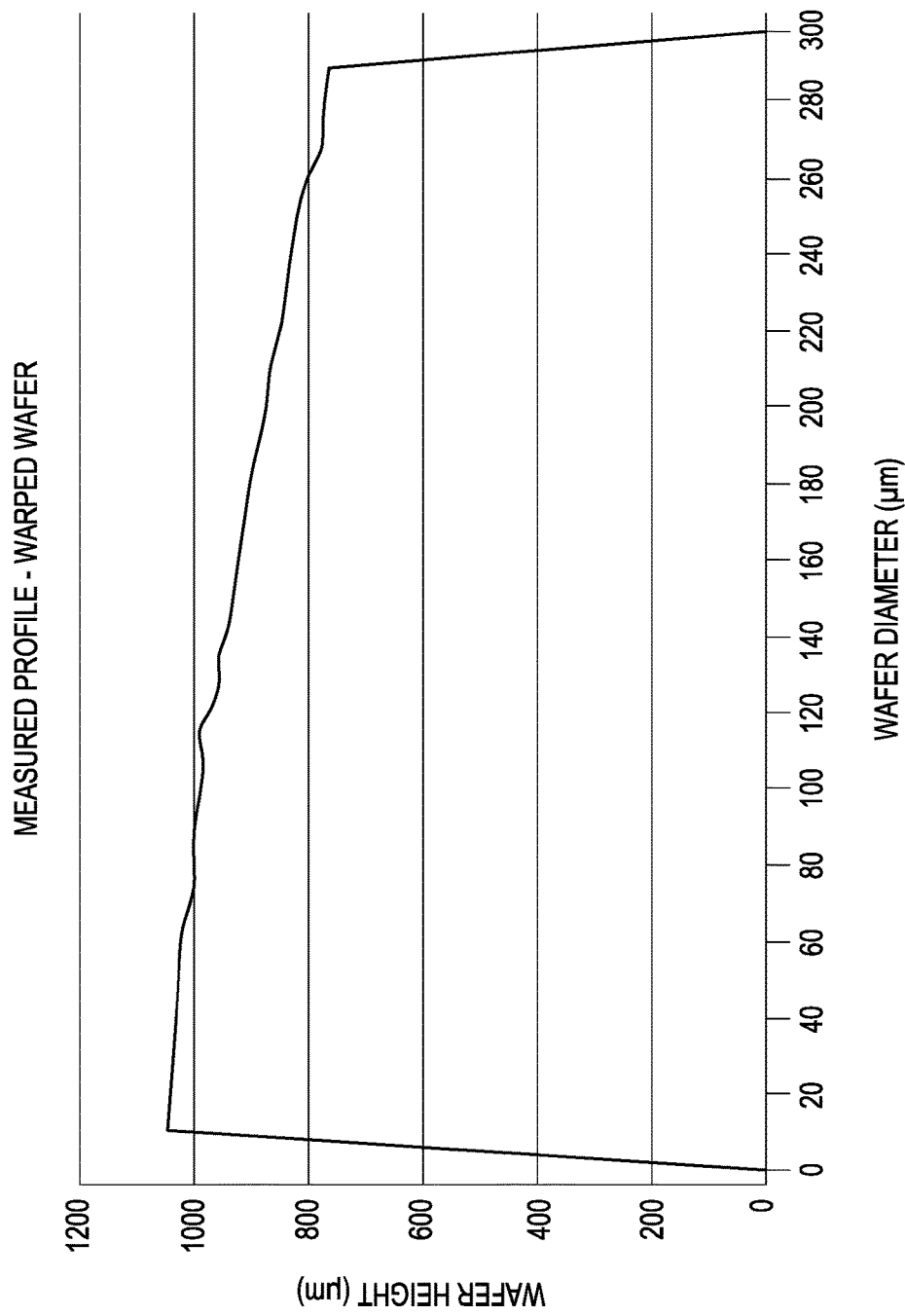
FIG. 5 depicts a graphical representation of plotted measurements of the sensor assembly of a substrate measurement apparatus on a warped substrate in accordance with an embodiment of the present principles.

FIG. 4 depicts a graphical representation of plotted measurements of the sensor assembly of a substrate measurement apparatus in accordance with an embodiment of the present principles on a flat substrate. FIG. 5 depicts a graphical representation of plotted measurements of the sensor assembly of a substrate measurement apparatus in accordance with an embodiment of the present principles on a warped substrate. As depicted in FIG. 4, the compiled measurement results indicate a flat profile for the substrate under test. In the embodiment of FIG. 4, sensor assembly measurements were taken, as described above, at increments of 10 mm across a substrate having a diameter of 300 mm. The plotted sensor measurements result in a baseline profile having a height of 770 µm across the entire measured surface of the substrate of FIG. 4.

The same measurement apparatus in accordance with the present principles was used to measure a warped substrate. In the embodiment of FIG. 5, sensor measurements were again taken at increments of 10 mm across a warped substrate having a diameter of 300 mm. As depicted in FIG. 5, the plotted sensor measurements depict an obvious decline in the height of the warped substrate. In FIG. 5, an initial sensor measurement indicated a height for the substrate of approximately 1050 µm and a final sensor measurement indicated a height for the substrate of approximately 770 µm, with sensor measurements in between the first and last measurement points indicating a steady decline in the height of the substrate between those two points.

The plotted measurements of FIG. 4 and FIG. 5 can be presented on a display 350 of, for example, the controller 104 using a HMI or graphical user interface to be presented to a user.

Using the data collected by the sensor assembly in accordance with the present principles, a determination can be made regarding whether the surface of a substrate is warped or flat and the extent to which the surface of a substrate is warped or flat. Such information can be used to compare the measurements of a measured substrate with tolerances for substrate surface flatness to determine, for example, if a substrate is acceptable for processing or not. If determined, based on the tolerances, that a substrate is not suitable for processing, the substrate can be sent to undergo corrective measures or can be eliminated from a processing routine.

Figure 6:
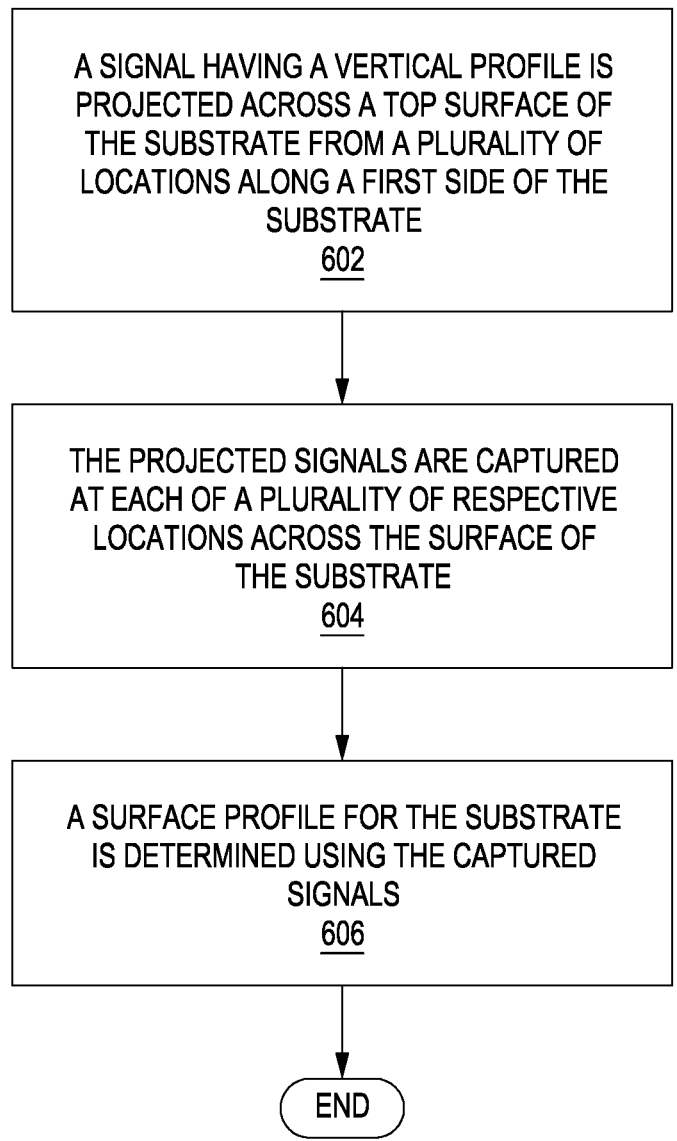
FIG. 6 depicts a flow diagram of a method for determining a profile of a surface of a substrate in accordance with an embodiment of the present principles.

FIG. 6 depicts a flow diagram of a method 600 for determining a surface profile of a substrate, for example, to determine warpage in accordance with an embodiment of the present principles. The method 600 begins at 602 during which a signal having a vertical component/profile is projected across a top surface of the substrate from a plurality of locations along a first side of the substrate. For example and as described above, a transmitter unit can project a signal having a vertical component/profile, such as a vertical laser column or any other vertical component of light or sound, from different locations along a first side of the substrate and across the surface of the substrate toward a receiver unit. The method can proceed to 604.

At 604, the projected signals are captured at each of a plurality of respective locations on a second side of the substrate located across the surface of the substrate. For example and as described above, a receiver unit aligned to receive the signals from the transmitter captures the signal after the signal translates across the surface of the substrate. The method can proceed to 606.

At 606, a surface profile for the substrate is determined using the captured signals. For example and as described above, the signals captured by the receiver unit at each respective location, includes a portion of the light column that was not blocked by any rise in the surface of the substrate. Such information is used, for example, by the controller to determine a surface profile of the substrate. That is, the encoder communicates positional information to the controller of a location of the sensor assembly with respect to the surface of the substrate and the receiver unit communicates signal information to the controller. Having such information, the controller is able to determine a representation of the surface of the substrate. The method 600 can then be exited.

In some embodiments in accordance with the present principles, the controller 104 includes a HMI or graphical user interface, which is presented on a display, such as display 350, such that a user is able to input test parameters and view profile results on the included display. For example, in one embodiment a user is able to input, using an input device such as a keyboard or touch screen of the controller 104, step increments or positional information as to where on a substrate under test a user would like sensor measurements taken. A user is also able to input information necessary to run a test as described above and have the controller automatically perform the test procedures. A user can also indicate that a test be run continuously and have the track assembly 112 run continuously as the sensor assembly takes continuous measurements. The signal results captured by the receiving unit are communicated to the controller 104 and the positional information from the encoder is communicated to the controller for use by the controller in determining a surface profile for the substrate under test. Such information can be used to determine if a surface of the substrate is warped and, if so, an amount of the warpage.

In various embodiments in accordance with the present principles, a controller 104 determines a surface profile of a substrate by recording received measurements with respect to received positional information to associate a height measurement of the surface of the substrate with where on the surface of the substrate the height measurement was taken. As described above, such information can be plotted on a graph for example as measurement height versus location on the surface of the substrate at which the measurement was taken, and presented on a display as a surface profile for a substrate under test. Such information can also be stored in a memory of the controller 104.

In various embodiments in accordance with the present principles, the substrate measurement apparatus 102 can be incorporated into an existing process chamber. For example, in one embodiment, the track assembly 112, the encoder 140, the sensor support assembly 114 including the transmitter unit 116 and the receiver unit 118, can be installed into an existing process chamber. As such, a substrate to be tested can be placed on a support pedestal of the process chamber and the sensor support assembly 114 including the transmitter unit 116 and receiver unit 118, the track assembly 112 and encoder 140 can be implemented as described herein to determine a surface profile for a substrate in the existing process chamber to, for example, determine if the substrate is warped. In other embodiments, a substrate measurement apparatus 102, or at least portions thereof, can be temporarily positioned, for example as a sub-assembly, in an existing process chamber to determine a surface profile for a substrate in the existing process chamber as described above.

Figure 7:
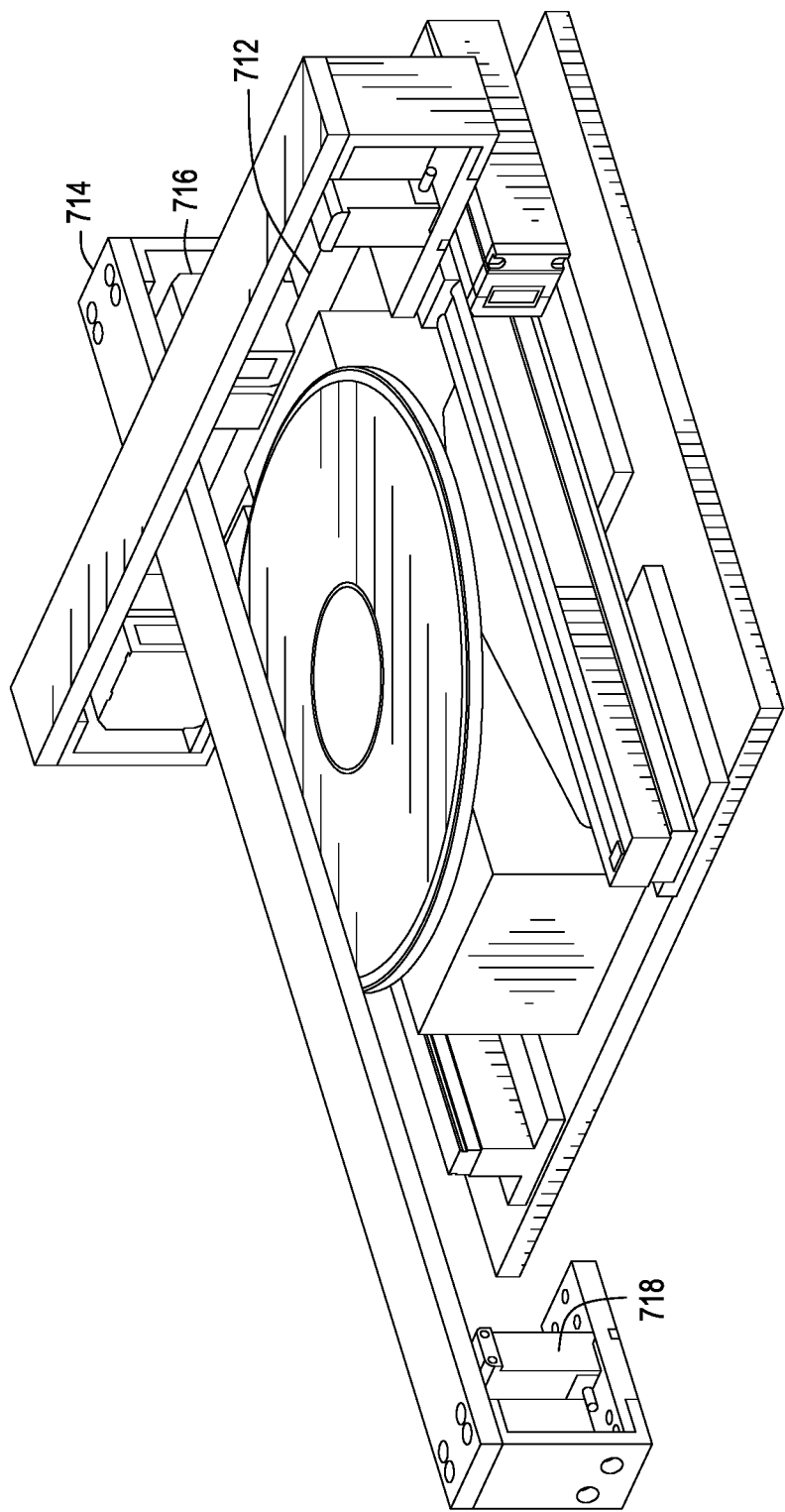
FIG. 7 depicts a high level block diagram of a substrate measurement apparatus for determining a profile of a surface of a substrate in accordance with another embodiment of the present principles.

In various embodiments in accordance with the present principles, a substrate measurement apparatus comprises a second track assembly, a second encoder, a second sensor support assembly and a second sensor assembly. For example, FIG. 7 depicts a high level block diagram of the substrate measurement apparatus of FIG. 2 including a second track assembly 712, a second encoder (not shown) mounted on the second track assembly 712, a second sensor support assembly 714 and a second sensor assembly including a second transmitter unit 716 and a second receiver unit 718. In the embodiment of FIG. 7, the second track assembly 712, second encoder (not shown), second sensor support assembly 714 and second sensor assembly including the second transmitter unit 716 and the second receiver unit 718 are implemented to project and capture a signal in a direction perpendicular to the projected and captured signal described with respect to the substrate measurement apparatus 102 of FIG. 2. As such, in the embodiment of FIG. 7, the substrate measurement apparatus is capable of taking measurements of a single point on the surface of the substrate, the single point being defined by where the signals from the first transmitter unit 116 and the second transmitter unit 716 cross on the surface of the substrate. In such embodiments, the first sensor support assembly 114 having the first sensor assembly mounted thereon and the second sensor support assembly 714 having the second sensor assembly mounted thereon can be moved independently and at different times or in other embodiments can be moved in unison.

While the foregoing is directed to embodiments of the present disclosure, other and further embodiments of the disclosure may be devised without departing from the basic scope thereof.

The invention claimed is:

1. A method for determining a surface profile for a substrate, comprising:
using a first transmitter, projecting a signal having a vertical profile across a top surface of the substrate from a first location along a first side of the substrate;
using a first receiver, capturing the projected signal at a respective location along a second side of the substrate located across the surface of the substrate from the first location;
linearly moving the first transmitter, in a direction substantially parallel to the top surface of the substrate, to at least a second location along the first side of the substrate;
projecting the signal across the top surface of the substrate from the at least second location;
linearly moving the first receiver in the same direction as the first transmitter and, using the first receiver, capturing the projected signal at respective locations along the second side of the substrate located across the surface of the substrate from the at least second location; and
determining a surface profile for the substrate using the captured signals.

2. The method of claim 1, wherein the projected signal comprises a laser beam comprising a vertical laser column.

3. The method of claim 1, comprising:
capturing a respective one of the projected signals at a location along the second side of the substrate located directly opposite from a location along the first side of the substrate from which a respective signal was projected.

4. The method of claim 1, comprising:
determining a surface profile for the substrate by evaluating an interruption in the projected signal at each location of the capturing.

5. The method of claim 4, comprising:
determining a height of the surface of the substrate at the location of the capturing by evaluating a height of the interruption in the projected signal.

6. The method of claim 1, comprising:
predetermining locations for capturing the projected signals; and
automatically performing the projecting and capturing across at least a portion of the surface of the substrate.

7. The method of claim 6, comprising:
determining the projection locations by a user using a human-machine interface on a controller; and
controlling a positioning of sensors used for the projecting and capturing using the controller.

8. The method of claim 7, comprising:
communicating captured signals to the controller to determine a surface profile for the substrate.

9. The method of claim 8, comprising:
plotting representations of the captured signals on a display to present a representation of the surface profile for the substrate.

10. An apparatus for determining a surface profile for a substrate, comprising:
a first sensor pair comprising:
a first transmitter to project a signal having a vertical profile across a top surface of the substrate from a plurality of locations along a first side of the substrate; and
a first receiver to capture the projected signals at each of a plurality of respective locations along a second side of the substrate located across the surface of the substrate;
a first track assembly to move the first sensor pair across at least a portion of the surface of the substrate to the plurality of locations along the first side of the substrate and concurrently to each of the plurality of respective locations along the second side of the substrate located across the surface of the substrate;
a first encoder to determine positional information associated with the first sensor pair; and
a substrate support to support the substrate;
wherein the first receiver communicates information associated with the captured signals from the first transmitter to a controller and the first encoder communicates the determined positional information of the first sensor pair to the controller to be used by the controller to determine a surface profile for the substrate using the information associated with the captured signals and the positional information.

11. The apparatus of claim 10, comprising:
a second sensor pair comprising:
- a second transmitter to project a signal having a vertical profile across a top surface of the substrate, perpendicular to the signal projected from the first transmitter, from a plurality of locations along a third side of the substrate;
- a second receiver to capture the projected signals at each of a plurality of respective locations along a fourth side of the substrate located across the surface of the substrate;
a second track assembly to move the second sensor pair across at least a portion of the surface of the substrate; and
a second encoder to determine positional information associated with the second sensor pair;
wherein the second receiver communicates information associated with the captured signals from the second transmitter to the controller and the second encoder communicates the determined positional information of the second sensor pair to the controller to be used by the controller to determine a surface profile for the substrate using the information associated with the captured signals and the positional information.

12. The apparatus of claim 11, comprising a second sensor support assembly to support and locate the second transmitter along the third side of the substrate and to support and locate the second receiver along the fourth side of the substrate, the second sensor support assembly being mounted on the second track assembly.

13. The apparatus of claim 12, comprising a second guide to guide an end of the second sensor support assembly.

14. The apparatus of claim 11, wherein the second sensor pair comprises a laser micrometer.

15. The apparatus of claim 10, comprising a first sensor support assembly to support and locate the first transmitter along the first side of the substrate and to support and locate the first receiver along the second side of the substrate, the first sensor support assembly being mounted on the first track assembly.

16. The apparatus of claim 15, comprising a first guide to guide an end of the first sensor support assembly.

17. The apparatus of claim 10, wherein the first sensor pair comprises a laser micrometer.

18. A system for determining a surface profile for a substrate, comprising:
a substrate measurement apparatus comprising:
- a first sensor pair including a first transmitter to project a signal having a vertical profile across a top surface of the substrate from a plurality of locations along a first side of the substrate and a first receiver to capture the projected signals at each of a plurality of respective locations along a second side of the substrate located across the surface of the substrate;
- a first sensor support assembly to support and locate the first transmitter along the first side of the substrate and to support and locate the first receiver along the second side across the surface of the substrate;
- a first track assembly to move the first sensor support assembly and the first sensor pair across at least a portion of the surface of the substrate to the plurality of locations along the first side of the substrate and concurrently to each of the plurality of respective locations along the second side of the substrate located across the surface of the substrate;
- a first encoder to determine positional information associated with the first sensor pair; and
- a substrate support to hold the substrate; and
a controller;
wherein the first receiver communicates information associated with the captured signals from the first transmitter to the controller and the first encoder communicates the determined positional information of the first sensor pair to the controller to be used by the controller to determine a surface profile for the substrate using the information associated with the captured signals and the positional information.

19. The system of claim 18, wherein the substrate measurement apparatus further comprises:
a second sensor pair comprising:
- a second transmitter to project a signal having a vertical profile across a top surface of the substrate, perpendicular to the signal projected from the first transmitter, from a plurality of locations along a third side of the substrate;
- a second receiver to capture the projected signals at each of a plurality of respective locations along a fourth side of the substrate located across the surface of the substrate;
a second track assembly to move the second sensor pair across at least a portion of the surface of the substrate; and
a second encoder to determine positional information associated with the second sensor pair;
wherein the second receiver communicates information associated with the captured signals from the second transmitter to the controller and the second encoder communicates the determined positional information of the second sensor pair to the controller to be used by the controller to determine a surface profile for the substrate using the information associated with the captured signals and the positional information.

20. The system of claim 19, wherein the controller comprises an interface for enabling user inputs.

* * * * *